(12) United States Patent
Balmelli (10) Patent No.: US 11,075,602 B1
(45) Date of Patent: Jul. 27, 2021

(54) OSCILLATOR COMPENSATION USING BIAS CURRENT

(71) Applicant: Silicon Laboratories Inc., Austin, TX (US)

(72) Inventor: Pio Balmelli, Arogno (CH)

(73) Assignee: Silicon Laboratories Inc., Austin, TX (US)

(*) Notice: Subject to any disclaimer, the term of this patent is extended or adjusted under 35 U.S.C. 154(b) by 0 days.

(21) Appl. No.: 16/821,166

(22) Filed: Mar. 17, 2020

(51) Int. Cl.
*H03B 5/04* (2006.01)
*H03B 5/24* (2006.01)

(52) U.S. Cl.
CPC ............... *H03B 5/04* (2013.01); *H03B 5/24* (2013.01)

(58) Field of Classification Search
CPC ........................................................ H03B 5/04
USPC ............................................................ 331/66
See application file for complete search history.

(56) References Cited

U.S. PATENT DOCUMENTS

| | | | | |
|---|---|---|---|---|
| 5,847,616 A * | 12/1998 | Ng | ............................ | H03B 5/24 331/57 |
| 6,294,962 B1 * | 9/2001 | Mar | ...................... | H03K 3/0231 331/111 |
| 7,701,301 B2 * | 4/2010 | Lakshmikumar | .... | H03K 3/0315 331/57 |
| 8,508,200 B2 | 8/2013 | Yamamoto et al. | | |
| 9,529,374 B2 | 12/2016 | Enjalbert et al. | | |
| 2005/0174183 A1 * | 8/2005 | Tachibana | .............. | H03B 5/364 331/158 |
| 2017/0063229 A1 | 3/2017 | Powell | | |
| 2017/0093399 A1 | 3/2017 | Atkinson et al. | | |
| 2019/0339729 A1 | 11/2019 | Bink et al. | | |

OTHER PUBLICATIONS

U.S. Appl. No. 16/793,142, filed Feb. 18, 2020, "Voltage Regulator Having Minimal Fluctuation in Multiple Operating Modes," by Ricky Setiawan.
U.S. Appl. No. 16/793,154, filed Feb. 18, 2020, entitled "Providing Low Power Charge Pump for Integrated Circuit," by Hua Beng Chan.
Wikipedia, "Low-dropout regulator," https://en.wikipedia.org/wiki/Low-dropout_regulator, last updated Dec. 19, 2019, 6 pages total.

\* cited by examiner

*Primary Examiner* — Joseph Chang
(74) *Attorney, Agent, or Firm* — Trop, Pruner & Hu, P.C.

(57) ABSTRACT

In one embodiment, an apparatus includes: a bias circuit having a replica circuit, the bias circuit to generate an oscillator current that is proportional to a variation of the replica circuit; an oscillator circuit coupled to the bias circuit to receive the oscillator current and generate a plurality of signals using the oscillator current; and a waveform shaper circuit coupled to the oscillator circuit to receive the plurality of signals and generate at least one clock signal from the plurality of signals.

20 Claims, 9 Drawing Sheets

OSCILLATOR COMPENSATION USING BIAS CURRENT

BACKGROUND

Ring oscillators are used to generate clock signals. Typical ring oscillators include a delay line formed of at least three serially coupled inverters coupled in a ring. While these ring oscillators consume low power, their frequency is usually very coarse. This is so, because frequency highly depends on the process variation of the delay gates used to implement the delay line that determines the frequency of oscillation. In addition to an initial frequency error that can be calibrated in production, frequency also depends on circuit junction temperature. Frequency variation caused by temperature is usually high and cannot be calibrated.

One way of improving the frequency stability is by using a relaxation oscillator that, instead of relying on inverter gate-based delays, relies on charging and discharging of a capacitance through a resistor. Since resistors and capacitors are much more stable, the achieved frequency stability is much better. However, a relaxation oscillator still relies on a precise reference voltage and uses a comparator having a delay that is highly dependent on temperature. To make contribution of the comparator delay negligible, the speed must be very fast, and thus more power has to be consumed.

SUMMARY OF THE INVENTION

In one aspect, an apparatus includes: a bias circuit having a replica circuit, the bias circuit to generate an oscillator current that is proportional to a variation of the replica circuit; an oscillator circuit coupled to the bias circuit to receive the oscillator current and generate a plurality of signals using the oscillator current; and a waveform shaper circuit coupled to the oscillator circuit to receive the plurality of signals and generate at least one clock signal from the plurality of signals. The waveform shaper circuit may output the at least one clock signal having a different shape and a different level than the plurality of signals.

In an example, the apparatus further comprises a calibration circuit to execute a calibration sequence to calibrate a controllable resistance of the bias circuit and a frequency of the at least one clock signal independently. The calibration circuit may adjust the controllable resistance until a voltage of a node coupled to the controllable resistance corresponds to a predetermined voltage and store a calibration value for the adjusted controllable resistance in a configuration storage.

In an example, the oscillator circuit comprises a plurality of delay stages, each comprising: a NOR gate to receive outputs of two of the plurality of delay stages and to output an output signal; a current source coupled to the NOR gate; and a varactor coupled to the current source, where the current source is to charge the varactor based on the output signal. The calibration circuit may calibrate the varactor and store a calibration value for the varactor in a configuration storage, where the calibration circuit is to control a capacitance of the varactor based on the calibration value to cause the plurality of signals to be output having a predetermined frequency.

The oscillator circuit may generate the plurality of signals having a frequency dependent on the controllable resistance and the varactor, and independent of a threshold voltage of the NOR gate. The apparatus may further include a startup circuit coupled to the oscillator circuit to initially provide different control values to at least two of the varactors of the plurality of delay stages, and after the oscillator circuit begins to oscillate the calibration value is provided from the configuration storage to the varactor of the plurality of delay stages. The oscillator circuit may output the plurality of signals as sawtooth signals having a first period and a first level. The waveform shaper circuit may receive the plurality of sawtooth signals having the first period and the first level and output a plurality of square waveform signals having a second level different than the first level. In an example, the waveform shaper circuit comprises: a plurality of first devices each gated by one of the plurality of signals, and having a first terminal coupled to one of a plurality of output nodes; and a plurality of second devices each having a gate terminal coupled to one of the plurality of output nodes and first terminals coupled to another of the plurality of output nodes, where the waveform shaper circuit is to output a plurality of square waveform signals via the plurality of output nodes.

The apparatus may further comprise a frequency multiplier circuit coupled to the waveform shaper circuit, where the frequency multiplier circuit is to receive the plurality of square waveform signals and output a clock signal having a higher frequency than the plurality of square waveform signals. In an example, the frequency multiplier circuit comprises: a first NAND gate to receive a first portion of the plurality of square waveform signals; a second NAND gate to receive a second portion of the plurality of square waveform signals; and a third NAND gate to receive a first output of the first NAND gate and a second output of the second NAND gate and to output the clock signal having twice the frequency of the square waveform signals. In an example, the bias circuit comprises: a first device coupled to an analog supply voltage node and to output a first current to a control node; a controllable resistance coupled between the control node and a ground voltage node; the replica circuit having an input coupled to the controllable resistance, the replica circuit coupled to a bias current node that receives a bias current; an RC network coupled between the control node and the bias current node; and an output circuit coupled to the first device and the RC network, the output circuit to output the oscillator current.

In another aspect, a method includes: obtaining a first control value from a configuration storage; sending the first control value to a controllable resistor of a bias circuit of an integrated circuit to set a resistance of the controllable resistor, the bias circuit to generate an oscillator current for use by an oscillator core of the integrated circuit; obtaining a second control value from the configuration storage; sending the second control value to the oscillator core to set a capacitance of a plurality of delay stages of the oscillator core; operating the bias circuit to generate the oscillator current; and providing the oscillator current to the oscillator core to enable the oscillator core to output at least one signal having a first frequency.

In an example, the method further comprises: generating the oscillator current that is dependent on a temperature and a process of the integrated circuit; and outputting the at least one signal from the oscillator core having the first frequency that is independent of the temperature and the process of the integrated circuit. The method also may include: sending unbalanced control values to the oscillator core to set the capacitance of at least some of the plurality of delay stages to different levels to reduce an oscillation latency of the oscillator core; and after the oscillator core begins oscillation, sending the second control value to the oscillator core to set the capacitance of the plurality of delay stages to the same level.

In yet another aspect, an integrated circuit comprises: a bias circuit to receive a first current and generate an oscillator current that is dependent on a temperature and a process of the integrated circuit, the bias circuit including a controllable resistor; and an oscillator core coupled to the bias circuit, the oscillator core to output at least one output signal having a frequency that is at least substantially independent of the temperature and the process. The oscillator core may comprise: a plurality of delay stages, each to receive an output signal of two other of the plurality of delay stages and to generate an output signal and comprising: a current source; a varactor coupled to the current source; and a control circuit to control charge and discharge of the varactor with the current source using the oscillator current.

In an example, the integrated circuit further comprises a calibration circuit coupled to the oscillator core and the bias circuit to provide a first control value to the bias circuit to control the controllable resistor and to provide a second control value to the oscillator core to control the varactor of the plurality of delay stages. The bias circuit may further comprise a replica circuit to replicate variation of the control circuit of the plurality of delay stages. The integrated circuit may further include: a waveform shaper circuit coupled to the oscillator core to receive the output signal from the plurality of delay stages and generate at least one signal therefrom, where the waveform shaper circuit is to output the at least one signal having a different shape and a different level than the output signal from the plurality of delay stages; and a frequency multiplier circuit coupled to the waveform shaper circuit, where the frequency multiplier circuit is to receive the at least one signal and output a clock signal having a higher frequency than the output signal from the plurality of delay stages.

DETAILED DESCRIPTION

In various embodiments, a clock circuit includes an oscillator core that outputs multiple signals having an oscillation period that is stable across temperature and process variations. To this end, the oscillator core may be implemented as a hybrid circuit that includes features of both ring oscillators and relaxation oscillators. Specifically as described herein, multiple identically configured delay stages may be implemented with relaxation oscillators that couple together in a ring-based manner. This oscillator core thus outputs multiple signals, which may be delayed waveforms with respect to each other. And from these delayed waveforms, one or more clock signals may be generated.

With embodiments, a bias circuit is provided to generate a bias current for the oscillator core. This bias current may be controlled to be dynamically variable based on process and temperature variations so that the period of the oscillator output signals remains relatively stable. In this way, a threshold voltage dependency of internal circuitry of the oscillator core is removed.

In contrast, with a fixed current provided to an oscillator core, this threshold voltage determines the output signal's period, given temperature and process dependency of this threshold voltage. Instead with embodiments that generate a bias current that is proportional to a threshold voltage, a duration of the period the oscillator output is independent of threshold voltage.

While a clock circuit as described herein can be used in many different situations, for ease of example discussion, assume that the clock circuit is included in an integrated circuit. The clock circuit including an oscillator as described herein may be used to generate one or more clock signals for various uses within the integrated circuit. In a particular embodiment, such clock circuit may be used to generate, e.g., a 10 megahertz (MHz) clock signal that may be used for start up activities for a microcontroller or other circuitry. Of course embodiments are not limited in this regard and other implementations may be used to generate a wide variety of clock signals for a variety of use cases. Furthermore, understand while a single clock signal may be generated, this clock signal can be further processed (e.g., via one or more frequency dividers or multipliers) to generate additional clock signals having lower or higher frequencies.

Figure 1:
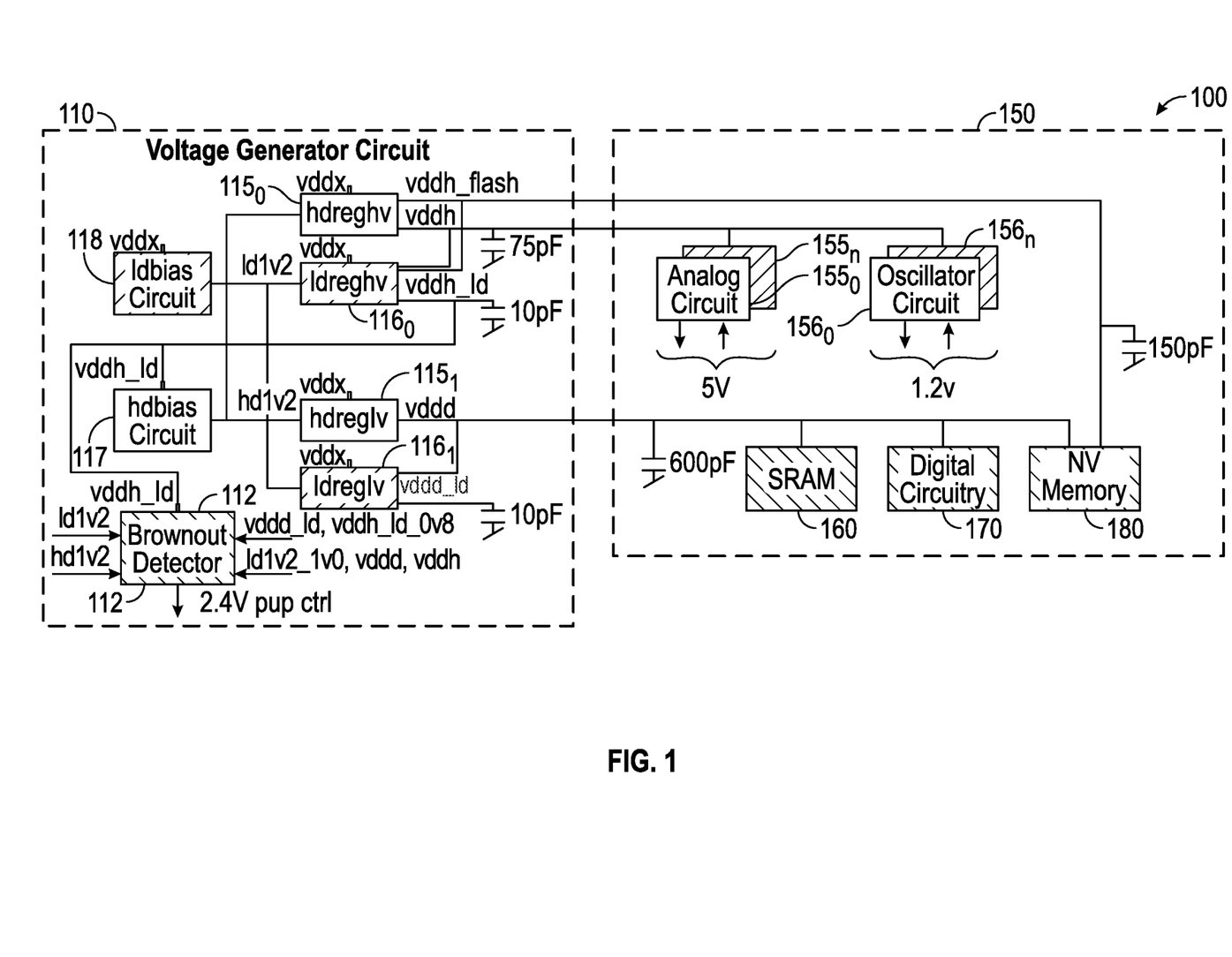
FIG. 1 is a high level block diagram of an integrated circuit in accordance with an embodiment.

Referring now to FIG. 1, shown is a high level block diagram of an integrated circuit (IC) in accordance with an embodiment. As shown in FIG. 1, IC 100 includes a voltage generator circuit 110 and circuitry 150, which may include the main analog and digital circuitry of IC 100. In the high level of FIG. 1, only a few relevant components within IC 100 are shown. Suffice to say, a given integrated circuit may include a wide variety of different components, ranging from processing circuitry such as processing cores, microcontroller units and so forth, to analog circuitry, memory circuitry, peripheral circuitry, radio frequency (RF) circuitry, and many other types of circuitry. In an embodiment, all circuitry shown in FIG. 1 may be implemented on a single semiconductor die.

In the high level shown, circuitry 150 includes a plurality of analog circuits $1550_{0-n}$. As examples, such analog circuits may include analog-to-digital converters, digital-to-analog converters, buffer circuitry, comparison circuitry and so forth. Circuitry 150 is further shown to include oscillator circuitry $1560_{0-n}$, which may be used to generate one or more clock signals for use within IC 100, and which may include an oscillator core as described herein. In addition, circuitry 150 further may include various memory devices, including static random access memory (SRAM) 160 and a non-volatile memory 180. In addition, circuitry 150 further includes digital circuitry 170 which may include various digital processing circuitry.

With reference to voltage generator circuit 110, different components are provided to enable generation of multiple voltages, both in a high power mode of operation (generally referred to herein as an HD mode) and in a low power mode of operation (generally referred to herein as an LD mode). As seen, voltage generator circuit 110 includes a brownout detector 112 to receive a regulated voltage output by at least one of multiple internal voltage regulators 115, 116 and determine presence of a brownout condition. As further shown, brownout detector 112 further may be configured to output a power control signal when it detects that regulators 115, 116 are outputting an appropriate regulated voltage. Brownout detector 112 may also detect a supply voltage (vddx), LD bandgap reference voltage (LDBIAS) and HD bandgap reference voltage (HDBIAS).

As further shown, voltage generator circuit 110 includes a plurality of voltage regulators 115 and 116. In an embodiment, voltage regulators 115, 116 may be implemented as low dropout (LDO) regulators. More specifically, multiple high power voltage regulators $115_{0,1}$ are provided to generate a plurality of regulated voltages. Such voltage regulators 115 may operate in a high power mode of operation. Note that this high power mode of operation corresponds to normal operation of IC 100 when it is active. Instead when operating in a low power mode, e.g., a snooze mode, voltage regulators 115 may be disabled and corresponding low power voltage regulators $116_{0,1}$ may be active to generate corresponding regulated voltages in the low power mode.

As further shown in FIG. 1, voltage generator circuit 110 also includes a plurality of bias circuits, namely bias circuits 117, 118, which may generate corresponding bias voltages to be provided to voltage regulators 115, 116. Those blocks of FIG. 1 shown in cross hatch are active both in low power mode and high power mode, such that these cross-hatched blocks are enabled in snooze mode.

In an embodiment, voltage regulators $115_0$, $116_0$ may output a regulated voltage that is at a higher voltage level, e.g., 2.4V. More specifically voltage regulators $115_0$, $116_0$ may output multiple higher voltage levels (vddh and vddh_flash). In an embodiment, voltage regulators $115_1$, $116_1$ may output a regulated voltage that is at a lower voltage level, e.g., 1.2V. Note that the voltage output lines from various regulators 115, 116 may include filter circuitry implemented by corresponding capacitors. While representative values are shown in FIG. 1, in other implementations such filters may have different capacitance levels.

With further reference to FIG. 1, note that the regulated low voltage output level vddd is shared between regulators $115_1$ and $116_1$. In normal operating modes, voltage regulator $115_1$ drives this output voltage. In snooze mode this voltage regulator is powered down and voltage regulator $116_1$ maintains the regulated voltage level. Similarly, the regulated high voltage output levels vddh and vddh_flash are shared between regulators $115_0$ and $116_0$. In normal operating modes, voltage regulator $115_0$ drives this output voltage. In snooze mode this voltage regulator is powered down and voltage regulator $116_0$ maintains the regulated voltage levels. Understand while shown at this high level in the embodiment of FIG. 1, many variations and alternatives are possible.

Figure 2:
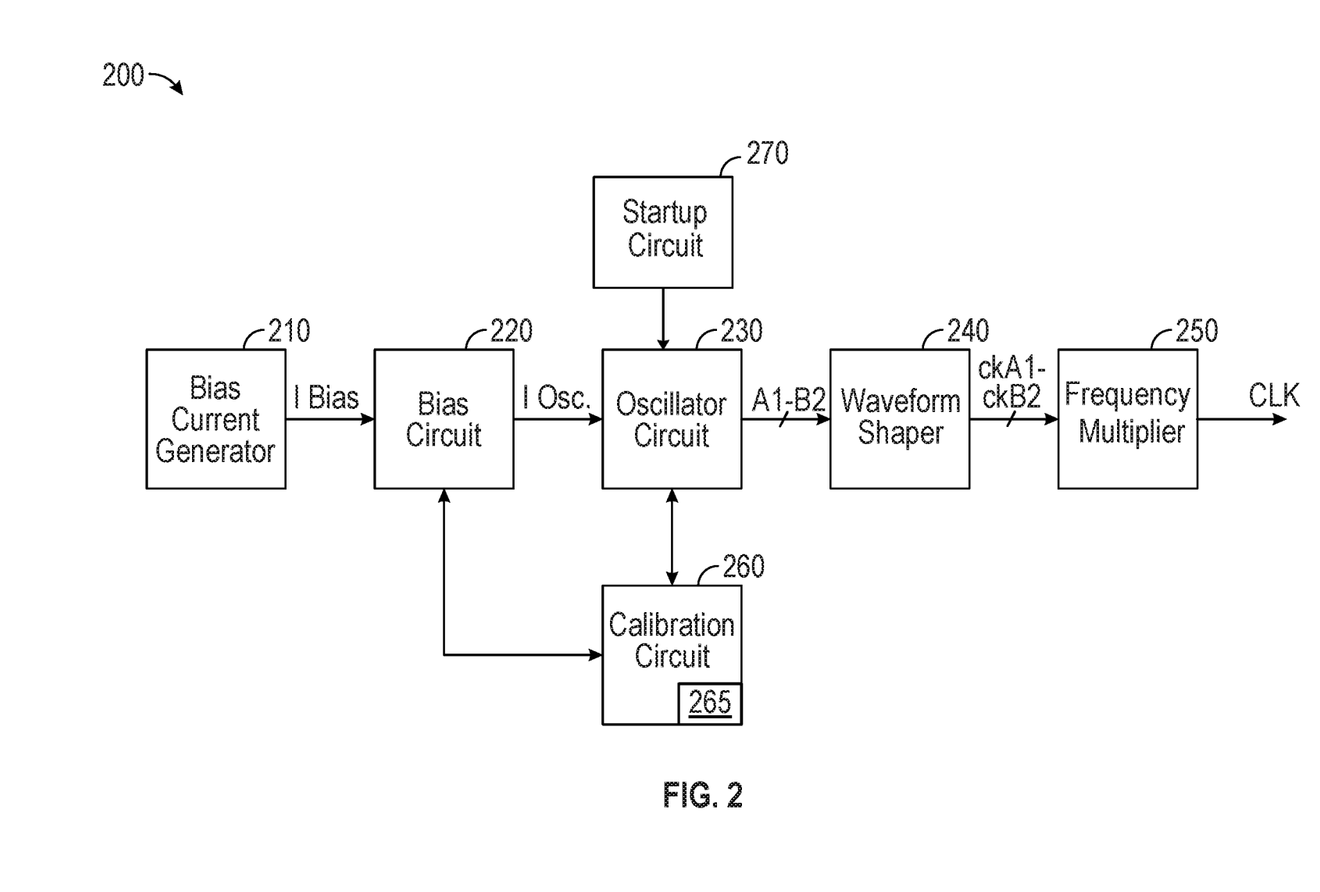
FIG. 2 is a high level block diagram of a clock circuit in accordance with an embodiment.

Referring now to FIG. 2, shown is a high level block diagram of a clock circuit in accordance with an embodiment. As shown in FIG. 2, clock circuit 200 is a hardware circuit that is used to generate one or more clock signals. In embodiments herein, clock circuit 200 generates a clock signal that is relatively insensitive to temperature and transistor process, while consuming very small current and chip area.

As shown, clock circuit 200 includes a bias current generator 210 to generate a bias current, Ibias, to be provided to a bias circuit 220. Although shown as part of clock circuit 200, understand that bias current generator 210 may be a separate bias current generator of an integrated circuit. In different implementations, bias current generator 210 may be implemented as a PTAT, VT/R, VREF/R or other current generator. In some cases this current can be self-generated. As shown, this bias current is provided to a bias circuit 220, which generates a current (Iosc) that is provided to an oscillator circuit 230.

Oscillator circuit 230 may be implemented with a plurality of delay stages and associated capacitors that are charged using this oscillator current Iosc. In embodiments herein, bias circuit 220 may generate an oscillator current that varies based on process and temperature such that this oscillator current is proportional to a threshold voltage of internal circuitry of bias circuit 220. With this controllable variable oscillator current, oscillator circuit 230 generates one or more oscillation signals having a stable frequency.

More specifically, oscillator circuit 230 may generate a plurality of oscillator signals, which in an embodiment may be sawtooth signals. As shown, oscillator circuit 230 may output four oscillator signals A1-B2 that are provided to a waveform shaper circuit 240 that may perform level shifting and transform sawtooth-shaped signals A1-B2 into square waves, namely signals ckA1-ckB2. In turn, these signals are provided to a frequency multiplier 250 that generates a single clock signal (CLK) from the waveforms.

In an embodiment, frequency multiplier 250 may be implemented as a frequency doubler such that the output clock signal is twice the frequency of the oscillator clock signals (namely double the frequency of the sawtooth signals output from oscillator circuit 230). By doubling the frequency, a higher frequency clock signal may be realized with lower power consumption.

As further illustrated in FIG. 2, a calibration circuit 260 couples to bias circuit 220 and oscillator circuit 230. In embodiments herein calibration circuit 260 may be used to calibrate a resistor within bias circuit 220 and also to calibrate one or more capacitors present in oscillator circuit 230. As shown, calibration circuit 260 includes a configuration storage 265, which may store at least a portion of the calibration results for use during normal operation. Calibration circuit 260 may further include a control circuit to execute instructions. For example, calibration circuit 260 may include a microcontroller or other control logic to execute instructions stored in at least one non-transitory storage medium. Such instructions may include instructions to cause control values stored in configuration storage 265 to be sent to circuitry of bias circuit 220 and oscillator circuit 230 to perform the calibrations described herein.

As further shown in FIG. 2, clock circuit 200 also includes a startup circuit 270 coupled to oscillator circuit 230. In embodiments herein, startup circuit 270 may be configured to provide multiple unbalanced control values to different varactors that form capacitances within oscillator circuit 230 on startup, to reduce a latency before oscillation begins. Details of such operation are described further below. While shown as a separate circuit in FIG. 2, understand that in some embodiments startup circuit 270 may be implemented within calibration circuit 260 or within another location of clock circuit 200. Although shown at this high level in the embodiment of FIG. 2, many variations possible.

Figure 3:
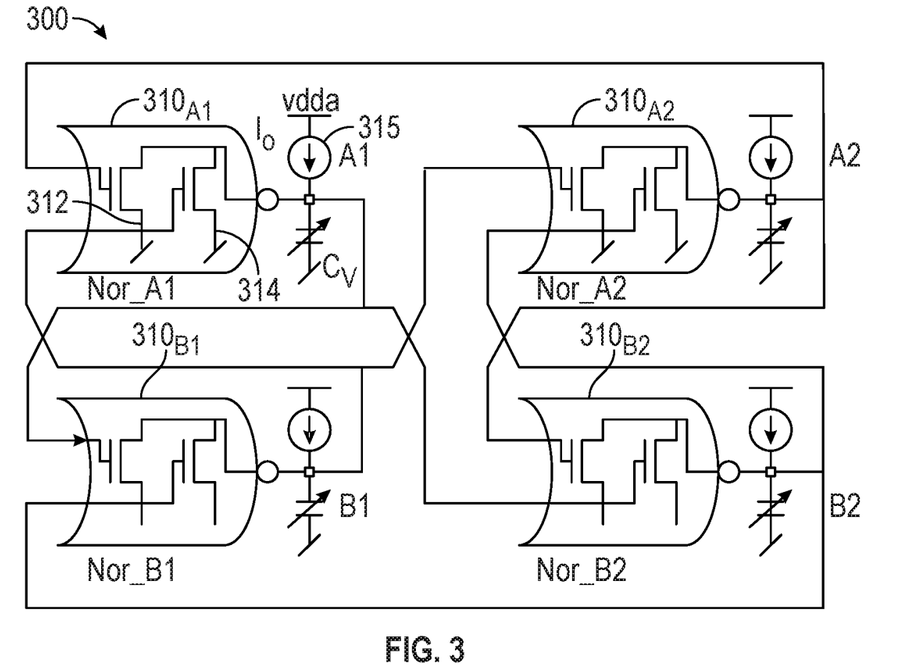
FIG. 3 is a schematic diagram of an oscillator circuit in accordance with an embodiment.

Referring now to FIG. 3, shown is a schematic diagram of an oscillator circuit in accordance with an embodiment. As shown in FIG. 3, oscillator 300 may be implemented as a series of relaxation oscillators, each having a NOR gate 310 coupled to a corresponding current source 315 (which represents the oscillator current $I_O$) and a controllable capacitance Cv. In an embodiment, capacitances Cv may be implemented as varactors. With reference to NOR gate $310_{A1}$, it is formed of a pair of metal oxide semiconductor field effect transistors (MOSFETs). More specifically, NOR gate 310 includes 2 n-channel MOSFET (NMOS) devices 312, 314. The NOR gate functionality also includes a current source that pulls the output to one when both inputs are zero. As seen, each device is gated by an output signal of one of the other stages. Each NMOS device 312, 314 has a source terminal coupled to a ground voltage node and a drain terminal coupled to an output node. The other NOR gates 310 are similarly arranged.

With this arrangement, each NOR gate 310 outputs a signal that acts as an input to two of the other NOR gates 310. As seen, current source 315 couples between a supply voltage node and an output node to which NOR gate 310 couples. The supply voltage node is configured to receive an analog supply voltage (vdda), which may be provided at 2.4 volts. Note this vdda voltage level may be at the same voltage level as vddh of FIG. 1. As such, oscillator 300 is present in an analog domain of an IC. Current source 315 is adapted to charge varactor Cv when a path is established between current source 315 and varactor Cv (based on the output of corresponding NOR gate 310, which thus acts as a control circuit to control charge and discharge of corresponding varactors Cv). Note that the operation of coupling to the supply voltage (vdda) is implemented by current source 315 pulling the output to vdda when both inputs are zero. However the output does not reach vdda because the way the different stages are connected guarantees that as soon as the output reaches twice the threshold voltage (2×VT), it is pulled low by setting one of the inputs to high. Understand while shown with four delay stages in the embodiment of FIG. 3, it is possible for an oscillator core to have a different number of delay stages.

Figure 4:
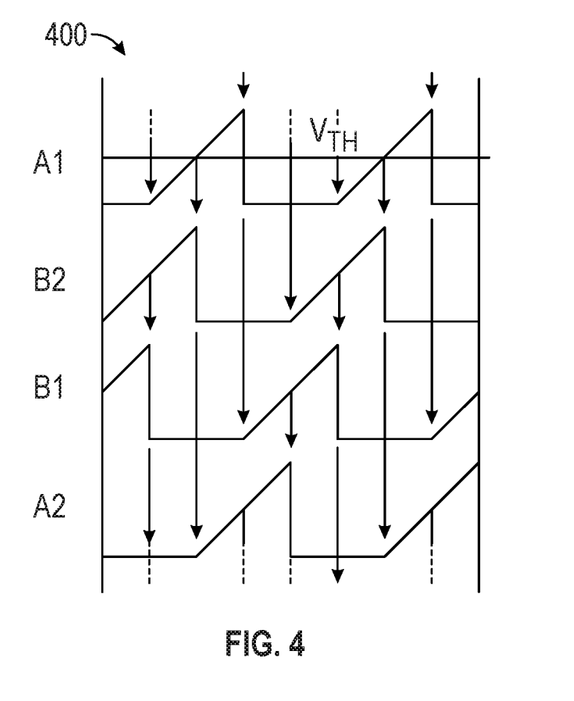
FIG. 4 is a timing diagram illustrating signals that an oscillator circuit outputs in accordance with an embodiment.

Referring now to FIG. 4, shown is a timing diagram illustrating signals that an oscillator circuit outputs. As shown in FIG. 4, timing diagram 400 illustrates sawtooth waveforms A1-B2, each of which corresponds to the output of one of NOR gates 310 of FIG. 3. As seen, each sawtooth waveform has an amplitude of 2×VTH, where VTH is the threshold voltage of the NMOS devices of the oscillator circuit's NOR gates, which are assumed to be at least substantially matching devices. In addition, each of the sawtooth waveforms is at a different, identically spaced phase, and has the same period of 4×VTH×Cv/Io.

Note that this period that is determined in part using a threshold voltage variable is for a situation in which a fixed oscillator current IO is provided to an oscillator core. With a fixed oscillator current, this threshold voltage variable determines how long the sawtooth signal period takes to reach its maximum amplitude (as its slope is fixed). Stated another way, with a fixed oscillator current, the period or duration of the slope of the sawtooth signal is variable and thus frequency becomes dependent on threshold voltage.

In contrast, embodiments may cancel any contribution of threshold voltage to oscillation period by providing a oscillator current that is proportional to a threshold voltage of replica circuitry of a bias circuit, details of which are described further below. With such arrangement, this oscillator current becomes dependent on both this threshold voltage (for the replica circuitry) and a controllable resistance (details of which are described further below). As such, in an embodiment when provided with this controllable oscillator current, the oscillator core output signals having a period equal to 4×R×Cv, where R is the controllable resistance. Thus the period of the sawtooth signals remains fixed, and the slope dynamically adjusts based on process and temperature. Stated another way, with a controllable oscillator current that varies based on threshold voltage, a slope of the sawtooth signals may dynamically adjust, rather than their period.

As shown in Table 1 below, sawtooth signals A1-B2 are formed of NOR-based logic operations between two of the sawtooth signals, which are illustrated with logic dependencies between these signals.

TABLE 1

| A1 = A2 NOR B1 | B1 = A1 NOR B2 |
| A2 = B1 NOR B2 | B2 = A1 NOR A2 |

Thus oscillator core 300 generates sawtooth signals, and as such these signals may not be appropriate to act as a clock signal. Furthermore, these signals may not be at an appropriate level (e.g., amplitude) for downstream circuitry. Accordingly, sawtooth signals generated by an oscillator core in accordance with an embodiment may be provided to a waveform shaper circuit.

Figure 5:
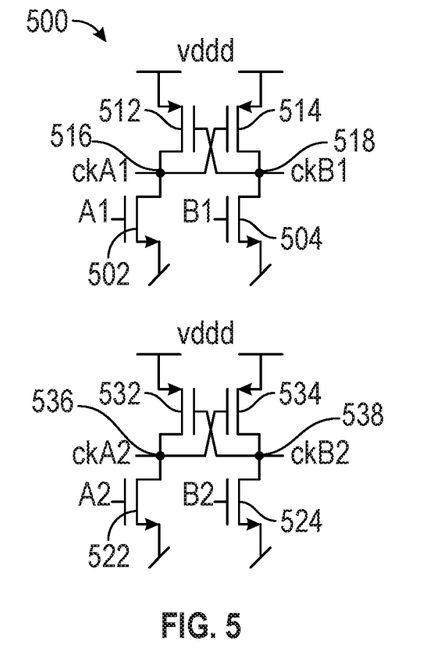
FIG. 5 is a schematic diagram of a waveform shaper circuit in accordance with an embodiment.

Referring now to FIG. 5, shown is a schematic diagram of a waveform shaper circuit in accordance with an embodiment. As illustrated, circuit 500 is a waveform shaper and level shifter. More specifically, waveform shaper circuit 500 may be used to generate level-shifted square waveforms that have the same period as the input sawtooth signals. Circuit 500 is formed of a plurality of NMOS devices and p-channel MOSFET (PMOS) devices to level shift and shape incoming sawtooth signals A1-B2.

As shown in FIG. 5, NMOS devices 502, 504 receive incoming sawtooth signals A1, B1 at their gate terminals. NMOS devices 502, 504 each have a corresponding source terminal coupled to a ground voltage node and a drain terminal coupled to one of corresponding output nodes 516, 518 to output square waves signals ckA1 and ckB1. As further shown, a pair of PMOS devices 512, 514 also couple to output nodes 516, 518. More specifically, PMOS device 512 has a gate terminal coupled to output node 518 and a drain terminal coupled to output node 516. In turn, PMOS device 514 has a gate terminal coupled to output node 516 and a drain terminal coupled to output node 518. Both NMOS devices 512, 514 have source terminals coupled to a supply voltage node. As shown, this supply voltage node is coupled to receive a digital supply voltage (vddd), e.g., at 1.2V. In this way, the incoming sawtooth signals (which have an amplitude of 2×VTH) are shaped into square waveforms and level shifted to 1.2 volts. As such, waveform shaper circuit 500 operates as a voltage crossing circuit to transition from an analog voltage domain (e.g., operating at 2.4 volts) to a digital voltage domain (e.g., operating at 1.2 volts).

Still with reference to FIG. 5, NMOS devices 522, 524 receive incoming sawtooth signals A2, B2 at their gate terminals. NMOS devices 522, 524 each have a corresponding source terminal coupled to the ground voltage node and a drain terminal coupled to one of corresponding output nodes 536, 538 to output square waves signals ckA2 and ckB2. As further shown, a pair of PMOS devices 532, 534 also couple to output nodes 536, 538. More specifically, PMOS device 532 has a gate terminal coupled to output node 538 and a drain terminal coupled to output node 536. In turn, PMOS device 534 has a gate terminal coupled to output node 536 and a drain terminal coupled to output node 538. Both NMOS devices 512, 514 have source terminals coupled to a supply voltage node. Of course other configurations may be possible for a waveform shaper circuit.

Figure 6:
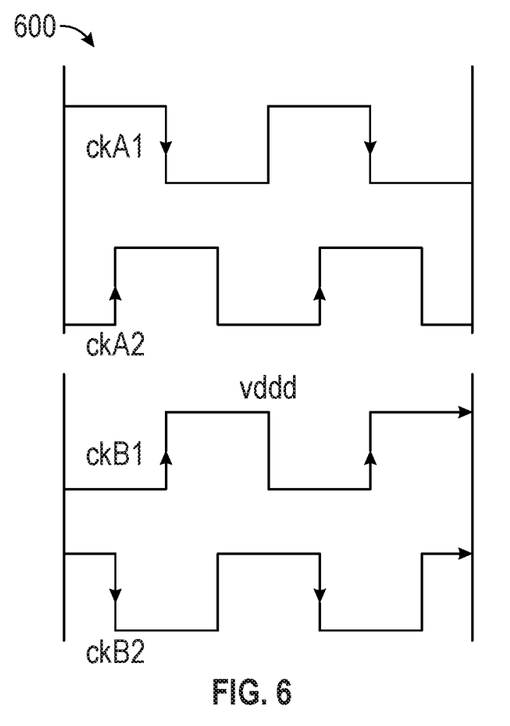
FIG. 6 is a timing diagram illustrating signals that a waveform shaper circuit outputs in accordance with an embodiment.

Referring now to FIG. 6, shown is a timing diagram illustrating signals that a waveform shaper circuit outputs. As shown in FIG. 6, timing diagram 600 illustrates a plurality of square waveform signals ckA1-ckB2. As seen, these signals may be at different phases and may have the same period as the sawtooth signals input to the waveform shaper circuit. Also note that the amplitude of these signals is at a digital voltage level, e.g., 1.2 volts.

While the square wave signals shown in FIG. 6 may be used as clock signals, it is also possible to further process the waveforms to generate a resulting clock signal. More specifically, it may be desirable to increase the frequency of the clock signals shown in FIG. 6, to obtain a higher frequency clock signal with reduced power consumption. To this end, a shaper circuit outputs clock signals to a frequency multiplier.

Figure 7:
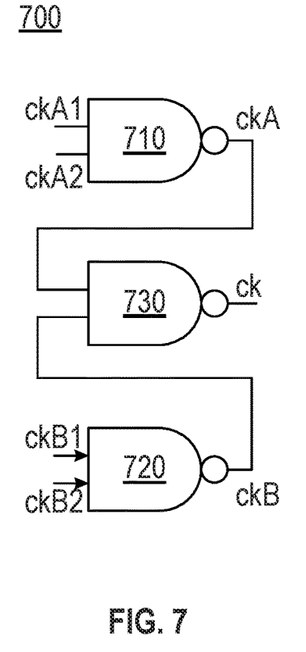
FIG. 7 is a schematic diagram of a frequency multiplier in accordance with an embodiment.

Referring now to FIG. 7, shown is a schematic diagram of a frequency multiplier in accordance with an embodiment. As shown in FIG. 7, circuit 700 includes a plurality of NAND gates configured to receive two square waveform signals and output a single square waveform signal having a different period. As shown a first NAND gate 710 has inputs to receive square wave clock signals ckA1 and ckA2 and output a single waveform ckA having the same period as the input square waveform signals, with a duty cycle change (e.g., to 75%). A second NAND gate 720 has inputs to receive square wave clock signals ckB1 and ckB2 and output a single waveform ckB having the same period and shape as ckA. As further shown in FIG. 7, frequency multiplier 700 further includes a NAND gate 730 that receives the two clock signals ckA and ckB, and outputs a clock signal ck having twice the frequency of the inputs to frequency multiplier 700. In this way, a clock signal is output with reduced power consumption. Although shown with this implementation in FIG. 7, many variations and alternatives are possible.

Figure 8:
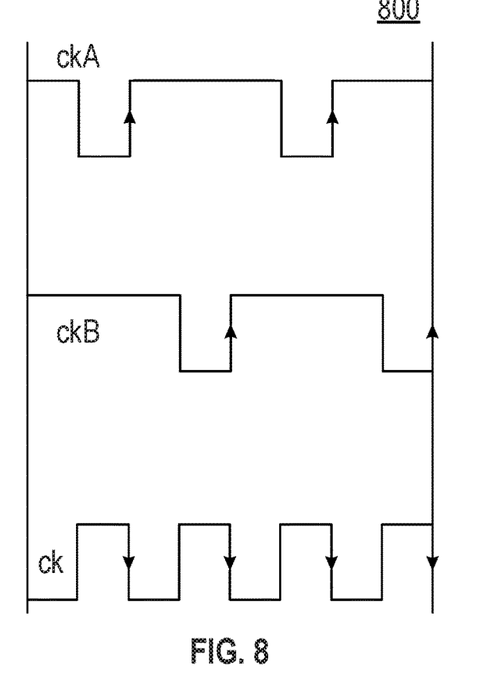
FIG. 8 is a timing diagram illustrating signals generated in a frequency multiplier in accordance with an embodiment.

Referring now to FIG. 8, shown is a timing diagram illustrating signals generated in a frequency multiplier in accordance with an embodiment. As shown in FIG. 8, timing diagram 800 includes waveform ckA and ckB, which correspond to the outputs of NAND gates 710, 720 of FIG. 7. As shown, these signals have a duty cycle greater than 50% and are at different phases. When these signals are provided as inputs to another NAND gate (namely NAND gate 730) of the frequency multiplier, a square waveform clock signal ck results that has twice the frequency of the sawtooth signals generated by the oscillator core.

Figure 9:
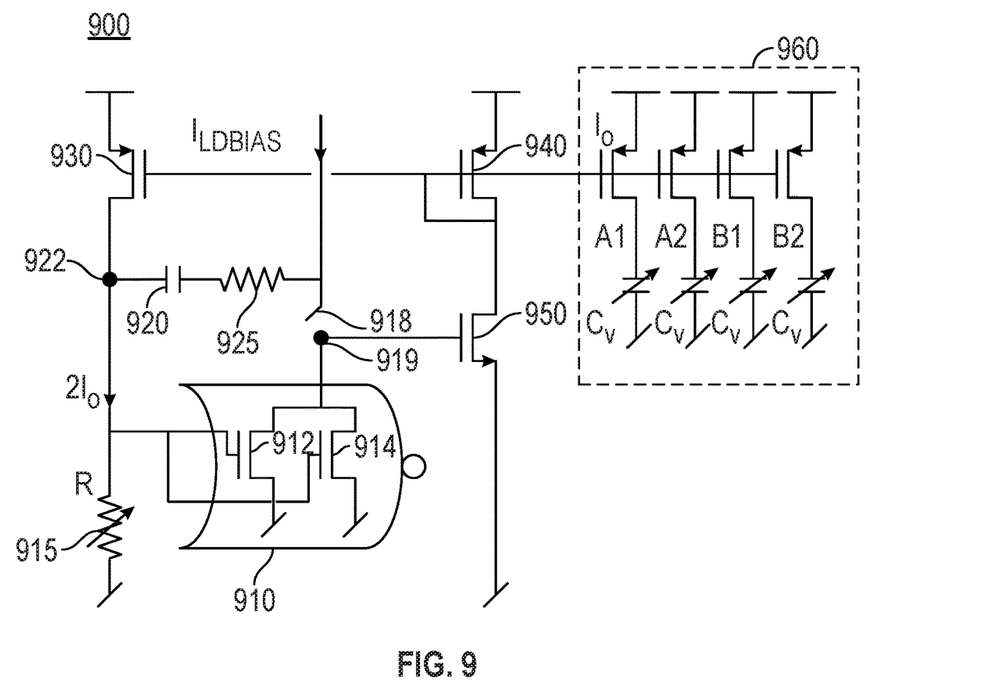
FIG. 9 is a schematic diagram of a bias circuit in accordance with an embodiment.

Referring now to FIG. 9, shown is a schematic diagram of a bias circuit in accordance with an embodiment. As shown in FIG. 9, a bias circuit 900 is used to generate an oscillator current that is provided to delay stages of an oscillator core. Note that in FIG. 9, a high level view of an oscillator core 960 is shown. In this high level view, only current sources with PMOS devices and varactors Cv are shown (that is, NOR gates that provide gating signals are not illustrated).

As shown in FIG. 9, bias circuit 900 includes a replica circuit 910 having NMOS devices 912, 914. Replica circuit 910 may be used as a replica of corresponding NOR gates within the oscillator core. Replica circuit 910 includes NMOS devices that substantially match NMOS devices present in NOR gates of oscillator core 960. Note that replica circuit 910 is not configured as a true NOR gate, in that both of its NMOS devices 912, 914 receive a common input, namely a voltage at a control node 922 that is coupled between a first PMOS device 930 and a controllable resistor 915, which may be implemented as a poly silicon resistor.

In embodiments, bias circuit 900 may be configured to generate a controllable oscillator current that is proportional to VTH of NMOS devices 912, 914 of replica circuit 910, which may vary based on temperature and process. By providing a bias circuit that generates a variable oscillator current based on process and temperature, any variation in VTH is compensated, such that oscillator core 960 outputs a stable frequency. With this arrangement, the output frequency of an oscillator core is dependent on this controllable resistor and varactor, and independent of threshold voltage.

As shown, PMOS device 930 acts as an input device and has a source terminal coupled to a supply voltage node to which an analog voltage (e.g. 2.4V) is provided. PMOS device 930 has a drain terminal that couples to this input to replica circuit 910, and a gate terminal coupled with the gate terminal of another PMOS device 940. As such, a current mirror is formed between PMOS devices 930, 940. Assuming NMOS devices 912, 914 operate in weak inversion and their VGS is approximately equal to VTH, then a node 919 coupled to NMOS device 950 sets itself up in such a way that NMOS device 950 draws a current that, when mirrored by PMOS device 940 onto PMOS device 930, flows into resistor 915 and builds a voltage at control node 922 that is equal to approximately VTH.

PMOS device 940, along with NMOS device 950, acts as an output circuit to provide the bias current used as Iosc. This bias current may be used to generate a VGS for PMOS current sources of oscillator core 960 to control charging/discharging of varactors of oscillator core 960. This VGS is proportional to the VGS of replica circuit 910. With embodiments, good power supply rejection can be realized via bias circuit 900.

As shown, PMOS device 940 is a diode-connected transistor with a source terminal coupled to the supply voltage node and commonly coupled gate and drain terminals. And NMOS device 950 in turn has a gate terminal that couples to replica circuit 910 and an RC network formed of a compensation capacitor 920 and a compensation resistor 925.

A switch 918 controllably couples replica circuit 910 into bias circuit 900. During a calibration routine to calibrate controllable resistance 915, switch 918 may be opened, and the gate terminal of NMOS device 950 is pulled low, and ILDBIAS is sent through another switch (not shown) to resistor 915 to provide a given current to controllable resistor 915 via control node 922. A control value for controllable resistor 915 may be dynamically updated to vary its resistance, while a voltage at control node 922 is measured. In different implementations, the voltage at control node 922 can be read through a diagnostic bus, digitized or sent to a pin to be measured externally.

When this voltage meets a predetermined level, a current setting for the control value for controlling controllable resistor 915 may be identified and stored. In an embodiment, the level is determined based on simulations and/or lab characterization and based on the assumption that the junction temperature during calibration is known a priori. For example, assuming that this resistor calibration is done during production testing, the value may be stored in an appropriate storage location of a tester and then downloaded into a configuration storage of the integrated circuit (e.g., such as configuration storage 265 of FIG. 2). This resistor calibration may be performed to control a threshold voltage compensation of bias circuit 900. More particularly here, this compensation is used to account for resistor variation in controllable resistor 915.

After this resistor calibration is performed, a frequency calibration may be performed by adjusting a capacitance of oscillator core 960 (after closing switch 918). To this end, a control value for varactor Cv may be dynamically updated to vary its capacitance, while an output frequency of oscillator core 960 is measured. When this frequency meets a predetermined level, a current setting for the control value for controlling varactor Cv may be identified and stored, similar to the process descried above. This frequency can be measured on-chip, using a more accurate clock source, or externally using an external clock source.

Figure 10:
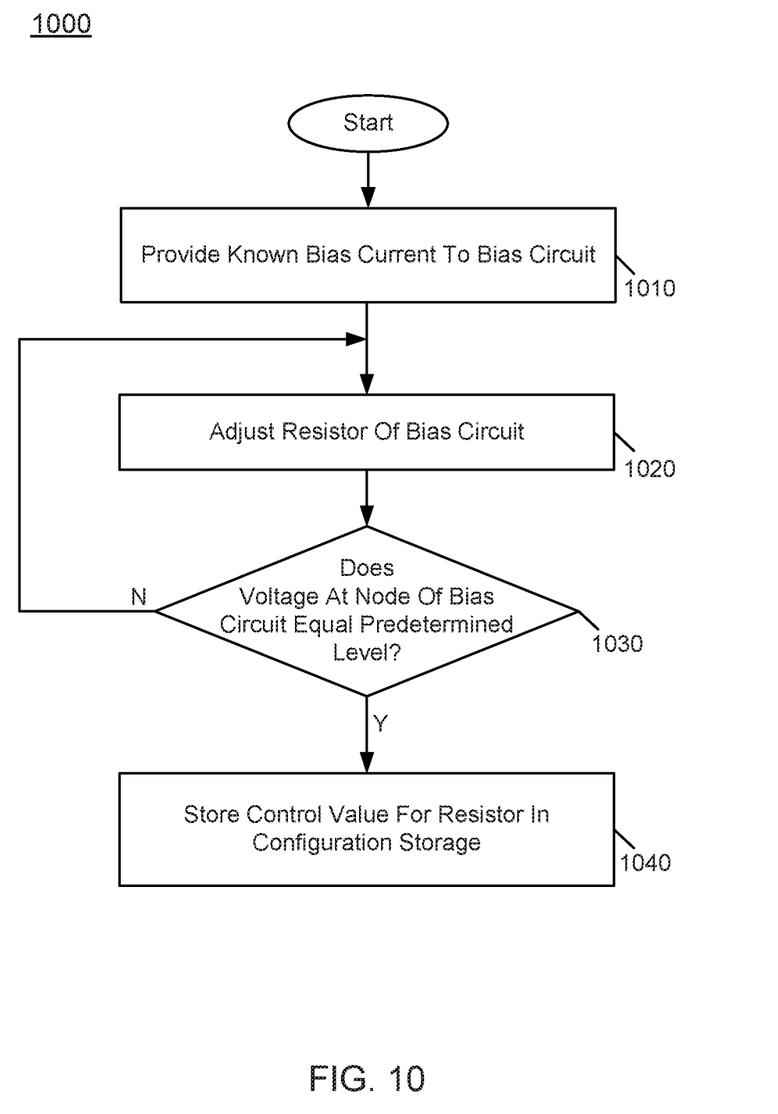
FIG. 10 is a flow diagram of a method in accordance with an embodiment.

Referring now to FIG. 10, shown is a flow diagram of a method in accordance with an embodiment. As shown in FIG. 10, method 1000 is a calibration method to calibrate a controllable resistance of a bias circuit, such as resistor 915 of FIG. 9. In one embodiment, method 1000 may be performed by hardware circuitry of a tester that operates during manufacture of an integrated circuit to generate calibration values for storage in a non-volatile storage of the integrated circuit. Such calibration values may be provided to various circuitry of the integrated circuit during normal operation to calibrate various components including a controllable resistor and one or more varactors as described herein. As such this tester may execute a program stored in at least one non-transitory storage medium that can be used to generate these calibration values. In another implementation, method 1000 may be performed dynamically, by internal circuitry of an integrated circuit.

As shown, method 1000 begins by providing a known bias current to the bias circuit (block 1010). In an embodiment, this method may be performed during manufacturing testing in which the bias circuit is controlled such that the internal replica circuit (e.g., replica circuit 910 of FIG. 9) may be disabled to enable this known bias current can flow through to the controllable resistor (e.g., controllable resistor 915). Thereafter, at block 1020 the resistance of this resistor may be adjusted. To this end, control signals may be provided, e.g., to switch devices that controllably switch in or out different amounts of resistance of this controllable resistance.

At each of these resistor values, a measurement can be made to determine a voltage at a node coupled to this resistor (e.g., at control node 922 of FIG. 9). At diamond 1030 it is determined whether this voltage equals a predetermined level. If not, the resistor may be further adjusted. Otherwise when it is determined that the voltage at this node equals the predetermined level, control passes to block 1040 where a control value for the resistor may be stored in a configuration storage. This control value is the value that will be used to program the controllable resistance during normal system operation. Understand while shown at this high level in the embodiment of FIG. 10, many variations and alternatives are possible.

Understand that after this resistance calibration, a calibration of a varactor of an oscillator core may be performed to achieve a target frequency. Such varactor calibration may generally take the same form as shown in FIG. 10, where the varactor capacitance is adjusted until the oscillator core outputs a desired frequency. Then the current setting of the control value for the varactor may be stored as another configuration value.

In one embodiment, the controllable resistor of a bias circuit and one or more varactors of the delay stages of an oscillator core may be programmable to trim a frequency of a resulting clock signal. Such trimming may be performed during integrated circuit manufacture as part of manufacturing testing. To this end, one or more systems may include one or more computer readable media that include instructions that when executed cause the one or more systems to perform a method. More specifically these instructions may cause the system to perform a method that includes: configuring a bias circuit coupled to an oscillator core of the integrated circuit, the bias circuit to provide an oscillation current to the oscillator core dependent on at least a temperature of the integrated circuit; disconnecting a replica circuit of the bias circuit, the replica circuit to mirror behavior of circuitry of the oscillator core; injecting a first current into the bias circuit; measuring, at a first node coupled to a controllable resistor of the bias circuit, a first voltage, the first node coupled to an input to the replica circuit; adjusting a setting of the controllable resistor until the measured first voltage equals a predetermined voltage and storing a control value for a corresponding setting of the controllable resistor; and providing the control value for storage in a configuration storage of the integrated circuit, to enable the bias circuit to use the control value to control the controllable resistor.

In an embodiment, the instructions further may cause the one or more systems to perform a method that includes: after storing the control value, measuring a frequency of at least one signal output by the oscillator core; and adjusting a setting of varactors of the oscillator core until the frequency equals a predetermined frequency. In addition, the method may include: storing a second control value for a corresponding setting for the varactors; and providing the second control value for storage in the configuration storage of the integrated circuit to enable the integrated circuit to use the second control value to control the varactors.

Figure 11:
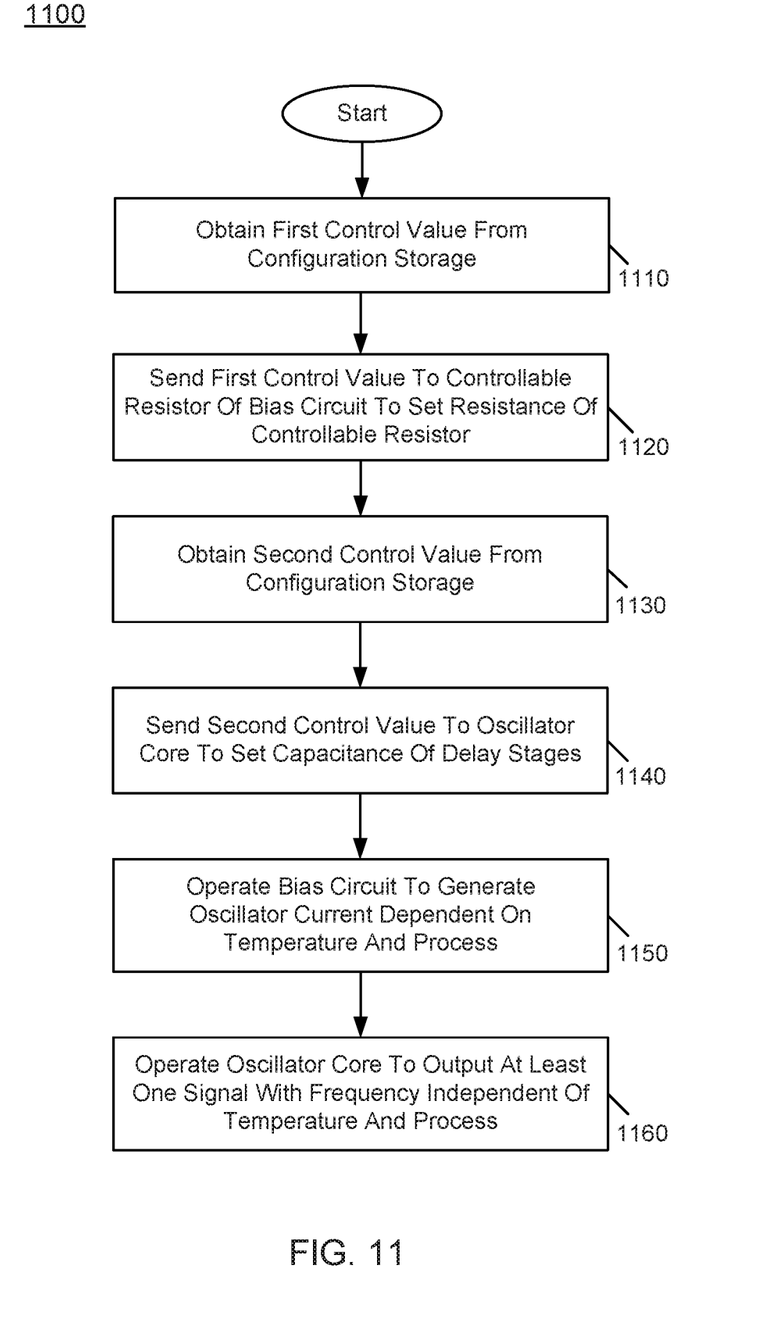
FIG. 11 is a flow diagram of a method in accordance with yet another embodiment.

Referring now to FIG. 11, shown is a flow diagram of a method in accordance with yet another embodiment. As shown in FIG. 11, method 1100 is a method of operating an integrated circuit having a bias circuit and an oscillator core as described herein. As seen, method 1100 begins by obtaining a first control value from a configuration storage (block 1110). Note that this configuration storage may be a register or other storage of the integrated circuit. In other cases, this configuration storage may be a non-volatile storage (either within the integrated circuit or coupled thereto) from which this first control value may be obtained.

More specifically, this first control value is a configuration setting for a controllable resistor of a bias circuit, as described herein. Thus as further shown in FIG. 11, at block 1120 this first control value can be sent to the controllable resistor of the bias circuit to set its resistance. For example, the first control value may be a set of bits, each to control a corresponding switch that selectively switches in or out a given amount of resistance of the controllable resistor.

Still referring to FIG. 11, next at block 1130 where a second control value is obtained from the configuration storage. This second control value is a configuration setting for varactors of an oscillator core, as described herein. Thus as further shown in FIG. 11, at block 1140 this second control value can be sent to the oscillator core to set its capacitance. For example, the second control value may be a set of bits, each to control a corresponding switch that selectively switches in or out a given amount of capacitance a varactor of each of the delay stages of the oscillator core.

Thus at this point, the oscillator is ready for normal operation. With further reference to FIG. 11, next at block 1150 the bias circuit may be operated to generate an oscillator current that is dependent on temperature and process. As such, this oscillator current may vary during normal operation, e.g., as temperature increases. However, this oscillation current is independent of one or more threshold voltages, such as a threshold voltage of corresponding transistors of a replica circuit of the bias circuit and/or NOR circuitry of delay stages of the oscillator core. The bias circuit outputs this oscillator current, which is provided to the oscillator core for use in generating one or more output signals. Specifically, at block 1160 the oscillator core may be operated to output at least one signal with a frequency that is independent of temperature and process. Understand while shown at this high level in the embodiment of FIG. 11, many variations and alternatives are possible.

As briefly discussed above, a startup circuit may be used to reduce oscillation latency on startup. This is so, since if all delay stages of an oscillator core have identical current, identical varactor and identical initial voltage, the A1, A2, B1, B2 nodes (e.g., as shown in FIG. 3) will settle with the same speed to the same voltage and there is no oscillation. In reality this does not happen because no component can be identical and because there is noise. However since an oscillator core is formed of closely matched components, this arrangement can still slow down the onset of oscillation.

To reduce this latency, a startup circuit may be configured to provide varactor control values that are initially unbalanced and set to different predetermined values so that internal nodes settle with different speeds. A calibrated (user programmed) varactor control value stored in a configuration storage is used only after a first clock edge appears at the output, i.e., such that oscillation has started. With this arrangement, there is no circuitry added to sensitive internal nodes. Instead a circuit external to the oscillator core provides unbalanced digital control signals in this startup phase.

Figure 12:
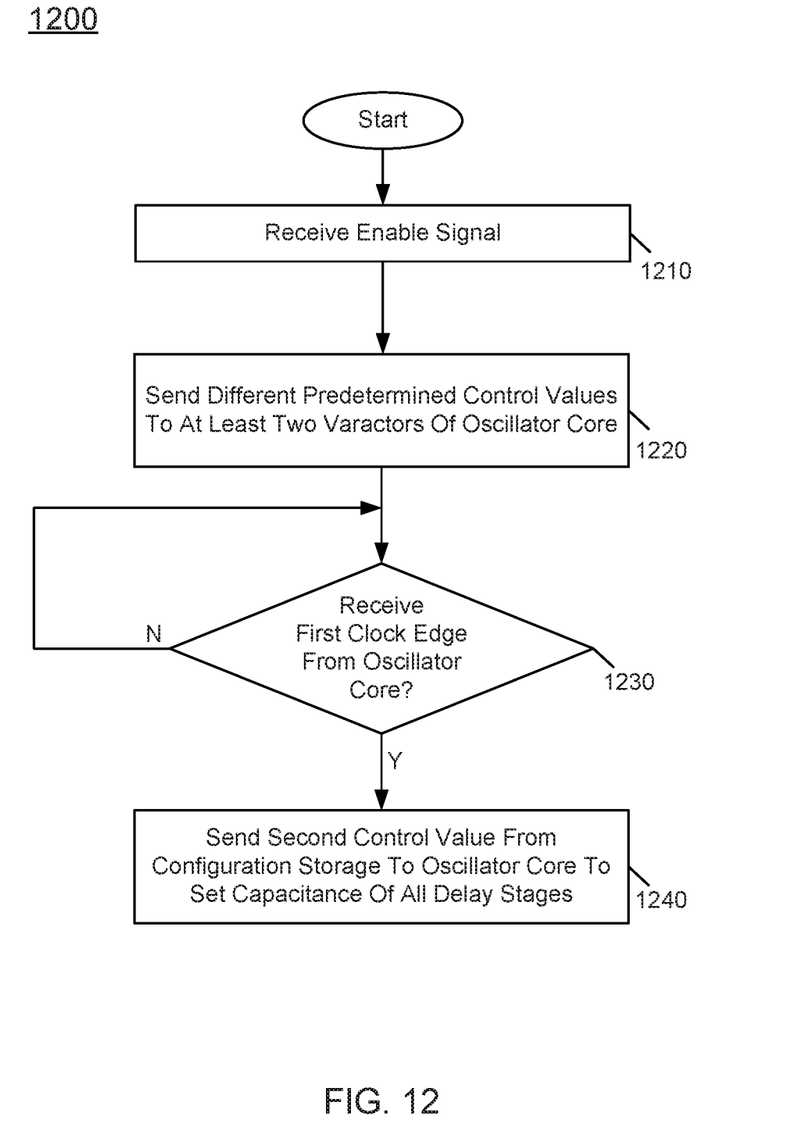
FIG. 12 is a flow diagram of a method in accordance with yet another embodiment.

Referring now to FIG. 12, shown is a flow diagram of a method in accordance with yet another embodiment. As shown in FIG. 12, method 1200 is a method for controlling startup of an oscillator core to reduce oscillation latency as described herein. In an embodiment, method 1200 may be performed by a startup circuit such as startup circuit 270 shown in FIG. 2.

Method 1200 begins by receiving an enable signal (block 1210). Such enable signal may be an enable signal to indicate that the oscillation circuit is enabled for operation. In other cases, instead of an enable signal, the initiating signal may be a reset or another signal. Control next passes to block 1220 where different predetermined control values are sent to at least two varactors of the oscillator core. In an embodiment, there may be at least two hard-coded control values that are sent such that at least one varactor (e.g., at least one of the four varactors Cv shown in FIG. 3) receives a different control value. With unbalanced capacitances controlled by way of these unbalanced control values, oscillation may begin more quickly.

Next at diamond 1230 it is determined whether a first clock edge has been received from the oscillator core. If so, control passes to block 1240 where a second control value may be sent from a configuration storage to the oscillator core to set a capacitance of all the delay stages. This second control value may be the user programmed, calibrated control value that causes all varactors of the delay stages to be set to the same capacitance for normal clock operation. Understand while shown at this high level in the embodiment of FIG. 12, many variations and alternatives are possible.

Figure 13:
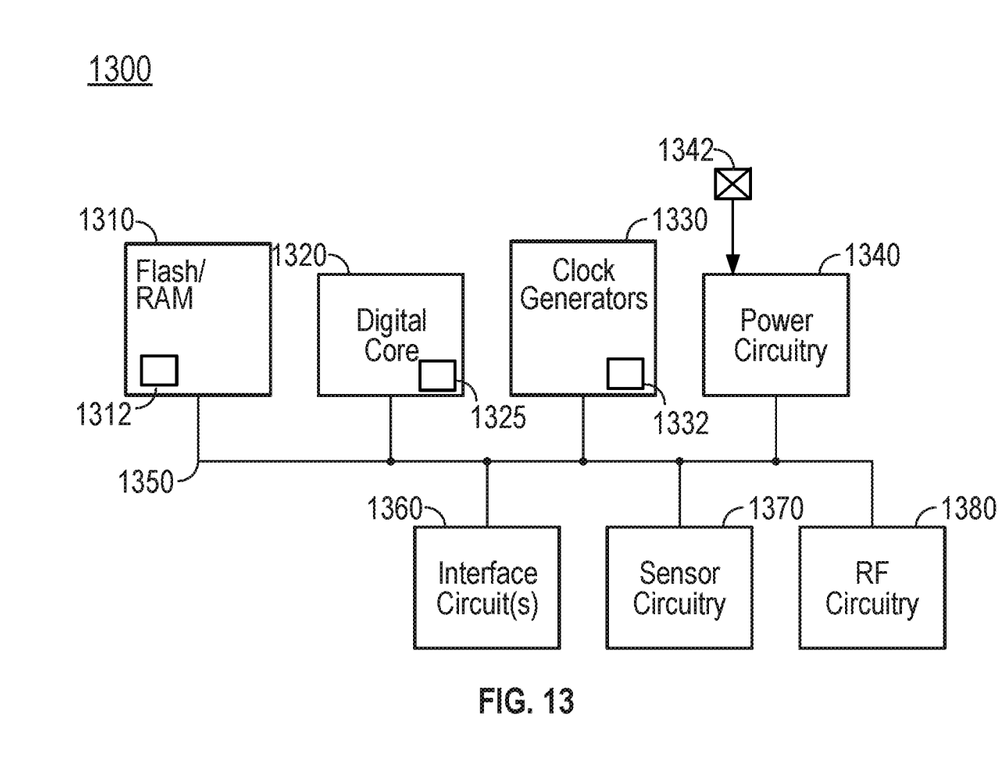
FIG. 13 is a block diagram of a representative integrated circuit in accordance with an embodiment.

Referring now to FIG. 13, shown is a block diagram of a representative integrated circuit 1300 which may include an oscillator circuit as described herein. In the embodiment shown in FIG. 13, integrated circuit 1300 may be, e.g., a microcontroller, wireless transceiver or other device that can be used for a variety of use cases, including sensing, monitoring, embedded applications, communications, applications and so forth. In the embodiment shown, integrated circuit 1300 includes a memory system 1310 which in an embodiment may include a non-volatile memory such as a flash memory and volatile storage, such as RAM. Memory system 1310 couples via a bus 1350 to a digital core 1320, which may include one or more cores and/or microcontrollers that act as a main processing unit of the integrated circuit. As shown, memory system 1310 includes a configuration storage 1312 which may include various configuration settings for IC 1300, including control values for a controllable resistor and varactor as described herein.

Clock generators 1330 may provide one or more phase lock loops or other clock generation circuitry to generate various clocks for use by circuitry of the IC. More specifically as described herein clock generators 1330 include a clock circuit 1332 which may be used to generate a clock signal that is substantially stable over temperature and process as described herein. To this end, digital core 1320 may include a calibration circuit 1325 which, during normal operation, may access control values in configuration storage 1312 for use in controlling a bias circuit and oscillator core within clock circuit 1332, as described herein.

Power circuitry 1340 may include one or more voltage regulators. As illustrated, at least one power pad 1342 may provide a voltage to power circuitry 1340, to be a supply voltage to one or more regulators of power circuitry 1340. As further illustrated in FIG. 13, additional circuitry optionally may be present depending on particular implementation to provide various functionality and interaction with external devices. Such circuitry may include interface circuitry 1360 which may provide interface with various off-chip devices, sensor circuitry 1370 which may include various on-chip sensors including digital and analog sensors to sense desired signals or so forth. In addition as shown in FIG. 13, RF circuitry 1380 may be provided which may include analog circuitry of a transceiver to enable transmission and receipt of wireless signals, e.g., according to one or more of a local area or wide area wireless communication scheme, such as Zigbee, Bluetooth, IEEE 802.11, cellular communication or so forth. Understand while shown with this high level view, many variations and alternatives are possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a bias circuit having a replica circuit, the bias circuit to generate an oscillator current, the oscillator current proportional to a variation of the replica circuit;
   an oscillator circuit coupled to the bias circuit to receive the oscillator current and generate a plurality of signals using the oscillator current; and
   a waveform shaper circuit coupled to the oscillator circuit to receive the plurality of signals and generate at least one clock signal from the plurality of signals, wherein the waveform shaper circuit is to output the at least one clock signal having a different shape and a different level than the plurality of signals.

2. The apparatus of claim 1, further comprising a calibration circuit to execute a calibration sequence to calibrate a controllable resistance of the bias circuit and a frequency of the at least one clock signal independently.

3. The apparatus of claim 2, wherein the calibration circuit is to adjust the controllable resistance until a voltage of a node coupled to the controllable resistance corresponds to a predetermined voltage and store a calibration value for the adjusted controllable resistance in a configuration storage.

4. The apparatus of claim 2, wherein the oscillator circuit comprises a plurality of delay stages, each comprising:
 a NOR gate to receive outputs of two of the plurality of delay stages and to output an output signal;
 a current source coupled to the NOR gate; and
 a varactor coupled to the current source, wherein the current source is to charge the varactor based on the output signal.

5. The apparatus of claim 4, wherein the calibration circuit is to calibrate the varactor and store a calibration value for the varactor in a configuration storage, wherein the calibration circuit is to control a capacitance of the varactor based on the calibration value to cause the plurality of signals to be output having a predetermined frequency.

6. The apparatus of claim 5, wherein the oscillator circuit is to generate the plurality of signals having a frequency dependent on the controllable resistance and the varactor, and independent of a threshold voltage of the NOR gate.

7. The apparatus of claim 5, further comprising a startup circuit coupled to the oscillator circuit, the startup circuit to initially provide different control values to at least two of the varactors of the plurality of delay stages, and after the oscillator circuit begins to oscillate the calibration value is provided from the configuration storage to the varactor of the plurality of delay stages.

8. The apparatus of claim 1, wherein the oscillator circuit is to output the plurality of signals as sawtooth signals having a first period and a first level.

9. The apparatus of claim 8, wherein the waveform shaper circuit is to receive the plurality of sawtooth signals having the first period and the first level and output a plurality of square waveform signals having a second level different than the first level.

10. The apparatus of claim 9, wherein the waveform shaper circuit comprises:
 a plurality of first devices each gated by one of the plurality of signals, and having a first terminal coupled to one of a plurality of output nodes; and
 a plurality of second devices each having a gate terminal coupled to one of the plurality of output nodes and first terminals coupled to another of the plurality of output nodes, wherein the waveform shaper circuit is to output a plurality of square waveform signals via the plurality of output nodes.

11. The apparatus of claim 10, further comprising a frequency multiplier circuit coupled to the waveform shaper circuit, wherein the frequency multiplier circuit is to receive the plurality of square waveform signals and output a clock signal having a higher frequency than the plurality of square waveform signals.

12. The apparatus of claim 11, wherein the frequency multiplier circuit comprises:
 a first NAND gate to receive a first portion of the plurality of square waveform signals;
 a second NAND gate to receive a second portion of the plurality of square waveform signals; and
 a third NAND gate to receive a first output of the first NAND gate and a second output of the second NAND gate and to output the clock signal having twice the frequency of the square waveform signals.

13. The apparatus of claim 1, wherein the bias circuit comprises:
 a first device coupled to an analog supply voltage node and to output a first current to a control node;
 a controllable resistance coupled between the control node and a ground voltage node;
 the replica circuit having an input coupled to the controllable resistance, the replica circuit coupled to a bias current node that receives a bias current;
 an RC network coupled between the control node and the bias current node; and
 an output circuit coupled to the first device and the RC network, the output circuit to output the oscillator current.

14. A method comprising:
 obtaining a first control value from a configuration storage;
 sending the first control value to a controllable resistor of a bias circuit of an integrated circuit to set a resistance of the controllable resistor, the bias circuit to generate an oscillator current for use by an oscillator core of the integrated circuit;
 obtaining a second control value from the configuration storage;
 sending the second control value to the oscillator core to set a capacitance of a plurality of delay stages of the oscillator core;
 operating the bias circuit to generate the oscillator current; and
 providing the oscillator current to the oscillator core to enable the oscillator core to output at least one signal having a first frequency.

15. The method of claim 14, further comprising:
 generating the oscillator current that is dependent on a temperature and a process of the integrated circuit; and
 outputting the at least one signal from the oscillator core having the first frequency that is independent of the temperature and the process of the integrated circuit.

16. The method of claim 14, further comprising:
 sending unbalanced control values to the oscillator core to set the capacitance of at least some of the plurality of delay stages to different levels to reduce an oscillation latency of the oscillator core; and
 after the oscillator core begins oscillation, sending the second control value to the oscillator core to set the capacitance of the plurality of delay stages to the same level.

17. An integrated circuit comprising:
 a bias circuit to receive a first current and generate an oscillator current that is dependent on a temperature and a process of the integrated circuit, the bias circuit including a controllable resistor; and
 an oscillator core coupled to the bias circuit, the oscillator core to output at least one output signal having a frequency that is at least substantially independent of the temperature and the process, the oscillator core comprising:
 a plurality of delay stages, each to receive an output signal of two other of the plurality of delay stages and to generate an output signal and comprising:
 a current source;

a varactor coupled to the current source; and a control circuit to control charge and discharge of the varactor with the current source using the oscillator current.

18. The integrated circuit of claim 17, further comprising a calibration circuit coupled to the oscillator core and the bias circuit, the calibration circuit to provide a first control value to the bias circuit to control the controllable resistor and to provide a second control value to the oscillator core to control the varactor of the plurality of delay stages.

19. The integrated circuit of claim 17, wherein the bias circuit further comprises a replica circuit to replicate variation of the control circuit of the plurality of delay stages.

20. The integrated circuit of claim 17, further comprising:

a waveform shaper circuit coupled to the oscillator core to receive the output signal from the plurality of delay stages and generate at least one signal therefrom, wherein the waveform shaper circuit is to output the at least one signal having a different shape and a different level than the output signal from the plurality of delay stages; and a frequency multiplier circuit coupled to the waveform shaper circuit, wherein the frequency multiplier circuit is to receive the at least one signal and output a clock signal having a higher frequency than the output signal from the plurality of delay stages.

\* \* \* \* \*